United States Patent [19]
Gross, Jr.

[11] Patent Number: 6,154,164
[45] Date of Patent: Nov. 28, 2000

[54] VARIABLE CLOCK RATE ANALOG-TO-DIGITAL CONVERTER

[75] Inventor: George Francis Gross, Jr., Fleetwood, Pa.

[73] Assignee: Lucent Technologies Inc., Murray Hill, N.J.

[21] Appl. No.: 09/153,183

[22] Filed: Sep. 16, 1998

[51] Int. Cl.[7] .................................................. G01S 13/52
[52] U.S. Cl. ........................ 341/163; 341/155; 341/165
[58] Field of Search ................................ 341/161, 162, 341/163, 155, 165, 183, 182

[56] References Cited

U.S. PATENT DOCUMENTS

| | | | |
|---|---|---|---|
| 5,260,705 | 11/1993 | Inukai | 341/155 |
| 5,272,481 | 12/1993 | Sauer | 341/165 |
| 5,585,796 | 12/1996 | Svensson et al. | 341/155 |

*Primary Examiner*—Michael Tokar
*Assistant Examiner*—John Nguyen
*Attorney, Agent, or Firm*—David L. Smith

[57] ABSTRACT

There is disclosed an integrated circuit including a successive approximation analog-to-digital converter. The successive approximation analog-to-digital converter can select which of at least two clock signals of different frequency drive the successive approximation converter for each bit determination. Each bit determination may employ a different clock frequency, or a particular clock frequency could be used for multiple bit determinations. The clock signals may be generated within the analog-to-digital converter, or the clock signal may be provided to the analog-to-digital converter.

9 Claims, 5 Drawing Sheets

$$V_{C1}(t) = V_0 (1-e^{-t/RC})$$

t = 0.684 ns

VARIABLE CLOCK RATE ANALOG-TO-DIGITAL CONVERTER

TECHNICAL FIELD

This application relates to analog-to-digital converters and more particularly to achieving greater speed of conversion in successive approximation converters.

BACKGROUND OF THE INVENTION

Analog-to-digital converters (ADCs) are used to convert an analog signal to a digitally coded signal. ADCs span a spectrum of designs that range from parallel flash-type converters employing multiple comparators that generally require a single clock cycle to determine all bits of resolution at one end of the spectrum, to a successive approximation-type converter that generally requires one clock cycle per bit of resolution at the other end of the spectrum. In order to achieve a high-speed conversion with little latency, a large number of comparators are employed in a flash converter. While flash converters achieve a fast conversion, they consume relatively large amounts of power. Successive approximation converters consume relatively less power than flash converters but introduce latency in converting an analog signal to a digitally coded signal. Successive approximation ADCs have been designed to operate on a fixed frequency clock, with the bit determination requiring the longest time being less than or equal to a clock cycle in duration. However, some time is wasted in a multibit successive approximation conversion since not all bit determinations require the same amount of time. With the successive approximation ADCs designed based on the worst-case bit determination time, all bit determinations other than the worst-case bit determination waste a portion of a clock cycle by completing the conversion of that bit in less time than the clock cycle duration.

What is needed is a technique to improve the speed of conversion of a successive approximation ADC such as by choosing the duration of a clock signal driving the successive approximation ADC based on the duration of time required for each bit determination.

SUMMARY OF THE INVENTION

In accordance with an illustrative embodiment of the present invention, an integrated circuit includes a successive approximation analog-to-digital converter. The successive approximation analog-to-digital converter can select from at least two clock signals of different frequencies to drive the successive approximation converter for each bit determination.

DETAILED DESCRIPTION

Figure 1:
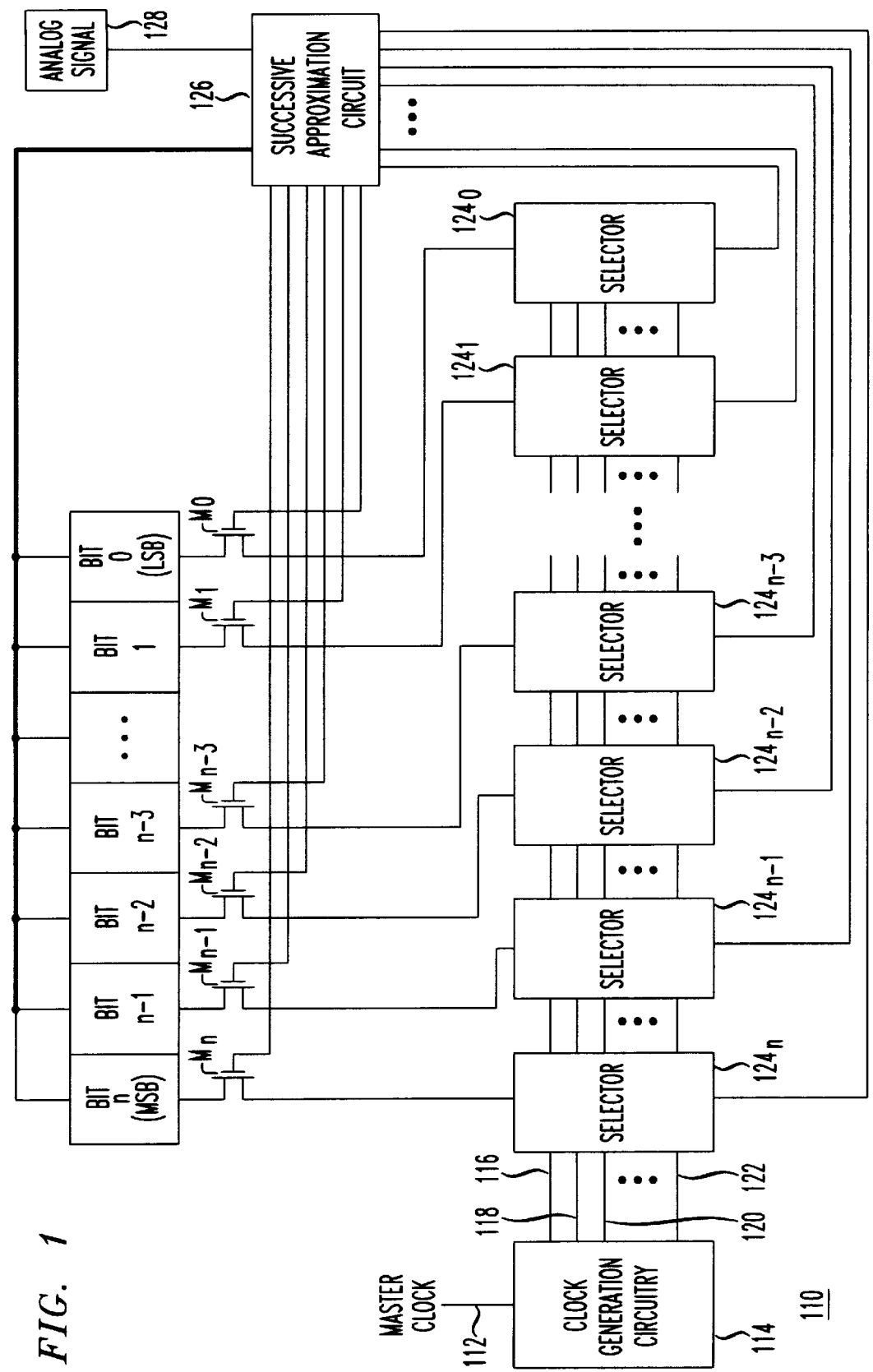
FIG. 1 is a schematic diagram of an analog-to-digital converter in accordance with the present invention.

A schematic diagram of an analog-to-digital converter 110 in accordance with the present invention shown in FIG. 1. ADC 110 is a successive approximation converter and may be of any type, including but not limited to a fixed range or a subranging converter, a single ended or a differential converter, a current driven or voltage driven converter, or a resistor string, current summing or charge summing converter. Converter 110 is of a design to convert a sampled analog signal into a plurality bits, a plurality being two or more.

A master clock signal 112 is either received by or generated by clock generation circuit 114. A number of clock signals 116, 118, 120 and 122, referred to collectively as available clock signals, of different frequencies, and hence different clock periods, are generated such as from master clock signal 112. The available clock signals are provided to selector circuits 124. When successive approximation circuit 126 is determining one of the plurality of bits of a digital signal representation of a sample of analog signal 128 input, successive approximation circuit 126 selects one of the available clock signals generated by clock generation circuit 114 by way of an associated switch, M, and selector circuit 124. The switches, M, are preferably transistors and are shown in the illustrative embodiment as metal oxide semiconductor (MOS) transistors using a simplified schematic symbol. Available clock signals 116, 118, 120 and 122 are illustrative and may be, for example, the master clock signal and multiples of the master clock signal as would be generated by successive divide-by-two circuits. Thus, by way of example, clock signal 116 may be the master clock signal, clock signal 118 may be twice the frequency of the master clock signal, clock signal 120 may be eight times the frequency of the master clock signal, and clock signal 122 may be sixteen times the frequency of the master clock signal.

Figure 2:
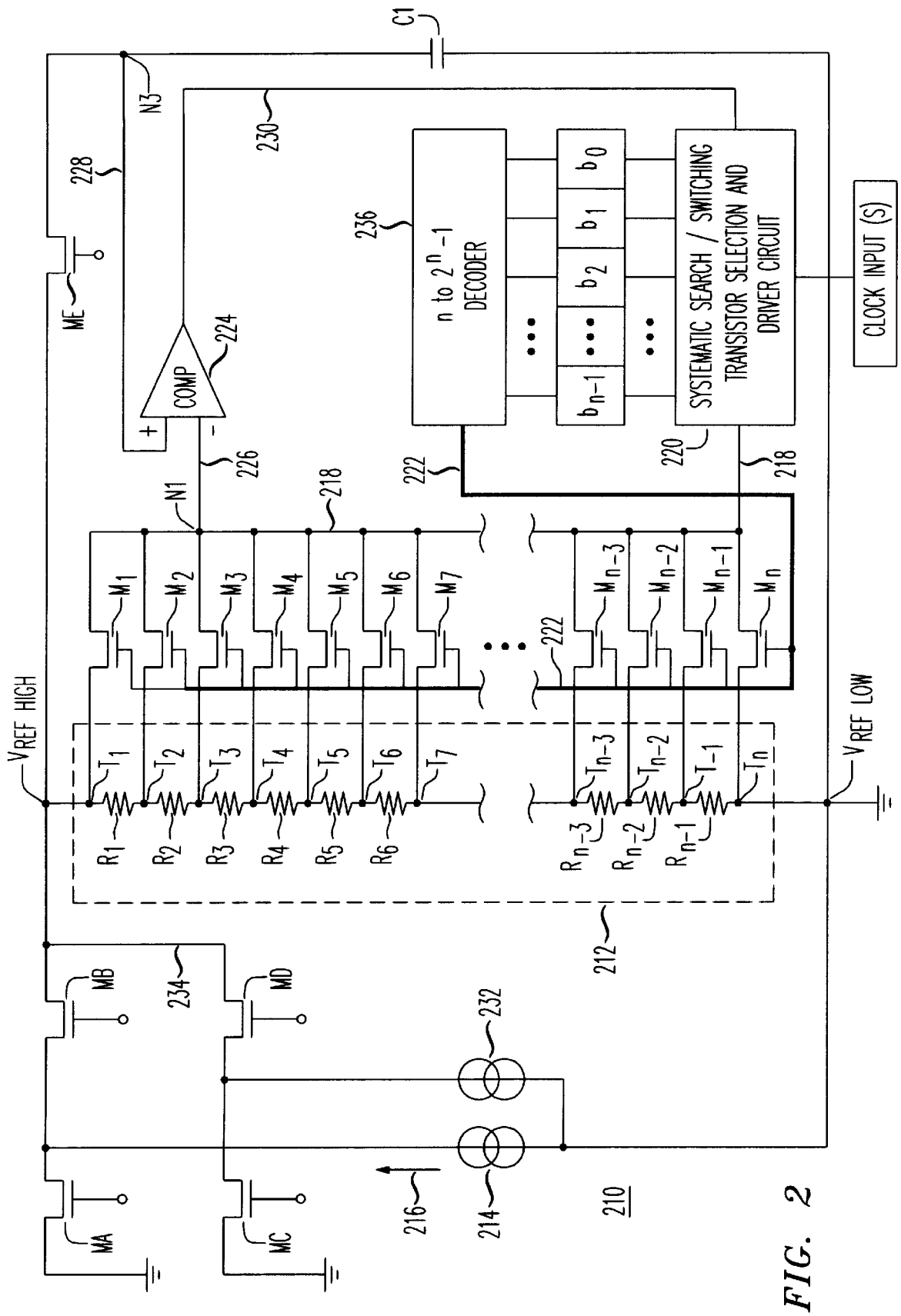
FIG. 2 is a schematic diagram of a successive approximation circuit that may be used as part of the analog-to-digital converter of FIG. 1.

A schematic diagram of a successive approximation circuit 210 useful in the converter 110 of FIG. 1 is shown in FIG. 2. Successive approximation circuit 210 is a multibit analog-to-digital converter capable of converting an incoming analog signal 232 to a multibit digitally encoded representation. The digital representation may be of any known convention, for example, binary, 2's complement, or sign magnitude.

Resistor string 212 is comprised of a user determined number N−1, of substantially equal resistors designated R1 through R N−1. Resistor string 212 is coupled between an upper reference VREFHIGH and lower reference VREFLOW. VREFHIGH is coupled to a power source, such as reference current source 214 which provides a constant current 216 to resistor string 212 (with transistor MB in the on-state and transistors MA and ME in the off-state) when successive approximation circuit 210 is employed as a stand-alone digital-to-analog converter or when successive approximation circuit 210 is incorporated in an analog-to-digital converter 110 as shown in FIG. 1. The resistance values of resistors comprising resistor string 212 are application dependent and can be readily selected by one skilled in the art based on a variety of parameters such as the power to be dissipated, the potential across, or developed across, the resistor string, the number of resistors in the resistor string and the number of bits of resolution of the converter. Typically, the impedance of each resistor in resistor string 212 is equal. See for example, U.S. Pat. No. 5,534,862, the disclosure of which is hereby incorporated by reference.

At the resistor junctions as well as the power source-resistor junctions, a switch, M, is coupled between the junction and a node such as node N1 on bus 218. The junctions define intermediate taps T1 through TN. The switches, N in number, which are preferably transistors, associated with the resistor string are shown in the illustrative embodiment as MOS transistors M1 through MN. Transistors M1 through MN each couple an intermediate tap, T1 through TN respectively, with bus 218 and hence node N1. Each transistor M1 through MN has its source-to-drain path coupled between bus 218, and hence node N1, and a respective intermediate tap. Transistors M1 through MN have their gate terminals coupled to a systematic search/switching transistor selection and driver circuit 220 by way of bus 222 and decoder 236. Each of taps T1 through TN is capable of being switched by a respective one of transistors M1 through MN to couple to a common bus 218 providing N, where $N=2^n$ voltages with n being defined as the number of bits in a digital signal representation of a sampled analog signal.

Transistors MA, MB, MC and MD as described below, alternately provide the analog signal illustrated as 232, which is to be sampled and converted, and a reference current 216 to other portions of successive approximation circuit 210.

Transistor ME, together with capacitor C1, comprise a sample and hold circuit. A sample of the analog signal 232 is applied to capacitor C1 as described below. Capacitor C1 is coupled between node N3 and the lower potential reference, VREFLOW. Capacitor C1 maintains the voltage developed thereon as the sampled analog signal being converted and provides the sampled analog signal as a positive input to comparator 224.

Comparator 224 has a first input 226 coupled to node N1 on bus 218, a second input 228 coupled to node N3 at capacitor C1, and an output 230. Output 230 is coupled as an input to systematic search/switching transistor selection and driver circuit 220.

In operation as an analog-to-digital converter, transistors MA, MD and ME are switched to be in the on-state, and transistors MB and MC, are switched to be in the off-state, an analog signal illustrated as 232 is received on line 234. The analog signal 232 passes through resistor string 212 and in the process develops a voltage across resistor string 212 which charges capacitor C1 with the voltage developed at VREFHIGH. Due to transistor MA being in the on-state, current produced by reference current source 214 is driven to ground. The voltage developed across resistor string 212 charges capacitors C1 to develop the sampled analog signal that is being converted to a digitally encoded signal and provides a positive input to comparator 224 over line 228. Since each of transistors MD and ME, along with the trace or conductor that couples these transistors to capacitor C1, have a finite impedance, an RC network is present and some time is required for capacitor C1 to charge to the voltage developed at VREFHIGH.

Figure 3:
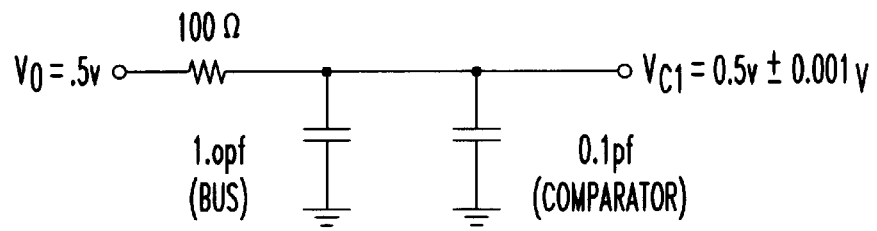
FIG. 3 is an equivalent circuit to the successive approximation circuit of FIG. 2 when determining the most significant bit.

With capacitor C1 charged to the voltage developed at VREFHIGH, transistors MA, MD and ME are switched to be in the off-state and transistors MB and MC are switched to be in the on state. At this point in operation of the ADC, the analog input signal 232 has been sampled and has settled. In this configuration, the analog signal 232 is sent to ground and a reference voltage is developed at VREFHIGH with a known voltage gradient developed across resistor string 212. Transistor ME in the off-state isolates capacitor C1 and the sampled signal stored thereon from resistor string 212 and the voltage gradient developed on resistor string 212. After the analog input signal has been sampled and settled, and a voltage gradient has been developed across resistor string 212 and it has settled, the switching transistor M(N/2) at the midpoint of resistor string 212 is switched on and the voltage developed at the midpoint of the resistor string, such as at tap TN/2, is coupled to bus 218 and hence node N1. The voltage provided at node N1 requires some time to settle due to the capacitance of bus 218 being charged and the switch (switching transistor M(N/2)) not having zero impedance. An equivalent circuit of the successive approximation circuit 210 in this configuration is shown in FIG. 3 and will be discussed further below.

With a reference voltage or current applied to resistor string 212, once bus 218 has settled into its final value or sufficiently close to its final value, comparator 224 compares the voltage developed at the midpoint of resistor string 212 (at tap (TN/2)+1) to the sampled analog signal stored on capacitor C1 to determine the most significant bit of the digital encoded representation of the sampled analog signal. For example, if the sampled analog, signal stored on capacitor C1 is greater than the voltage developed at the midpoint of resistor string 212 (at tap (TN/2)+1), the most significant bit (MSB) is a logic one and if the sampled analog signal stored on capacitor C1 is less than thee voltage developed at the midpoint of resistor string 212 tap (TN+1/2), the MSB is a logic zero.

Once the most significant bit is determined, the systematic search/switching transistor selecting and driver circuit 220 systematically switches the transistor coupling the midpoint of resistor string to make N1 (transistor M(N/2)) to the off-state and switches one of transistors M((N×3)/4) or transistor M(N/4) to the on-state, depending on whether the MSB was a one or a zero. These transistors represent coupling the point that is halfway between the midpoint of the resistor string and the upper and lower voltage references respectively, to bus 218 and hence node N1. When the MSB is determined to be a one, a switching transistor is turned on to couple the tap at the midpoint of the upper half of the resistor string 212 to node N1. When the MSB is determined to be a zero, a switching transistor is turned on to couple the tap at the of midpoint of the lower half of the resistor string 212 to bus 218 and hence node N1.

Since resistor string 212 is symmetrical about its midpoint, the analysis is the same without regard to whether the second most significant bit is determined by comparing the reference voltage developed the upper half of the resistor string to the sampled analog signal, such as when the MSB is one, or whether the second most significant bit is determined by comparing a reference voltage developed in the lower half of the resistor string to the sampled analog signal such as when thee MSB is zero.

With reference to the equivalent circuit shown in FIG. 3, the most significant bit determination is accomplished after an input sample/hold settling time during which the digital-to-analog converter is preset for the first preselected trial voltage point and the resistor string voltage settling due to resistor and capacitor changes and possible momentary selection overlay in the decoder 236 as it proceeds from one decoded output of 1 of $2^n-1$ to a second decoded output of 1 of $2^n-1$ occurs during the input sample and hold time. Thus, when determining the most significant bit, the settling time required for the successive approximation circuit 210 is the settling time for bus 218 and comparator 224. For subsequent bit determinations, two sequential settling times are required; the resistor string must settle and bus 218 and comparator 224 must settle.

By way of example, consider a 10-bit analog-to-digital converter with VREFHIGH at one volt and VREFLOW at ground. The least significant bit is represented by approximately one millivolt, $[1 \text{ volt}/(2^{10}-1)]$. Assume the sampled and held analog input voltage to be converted is 0.384 volts. The most significant bit (bit 9) determination cannot take place until bus 218 and comparator 224 have settled to within the voltage of the least significant bit, 0.001 volts. Assuming each switching transistor M1 through MN has an impedance of 100 ohms in the on-state and the capacitance of bus 218, as seen by the midpoint switching transistor, is approximately one picofarad, and the additional capacitance of comparator 224 is approximately 0.1 picofarad, the equivalent circuit is shown in FIG. 3. Since a reference voltage of one volt was developed across resistor string 212 and the midpoint is coupled by one of switching transistors M1–MN to bus 218, the voltage applied to the 100 ohm impedance of the midpoint switching transistor is 0.5 volts. The time constant of the equivalent circuit shown in FIG. 3 can be calculated to be 0.684 nanoseconds to allow the voltage at the comparator to reach 0.499 volts which is to within the value of one LSB of the voltage developed at the midpoint of the resistor string 212. The time constant of the equivalent circuit shown in FIG. 3 represents the settling time of bus 218 such that output 230 of comparator 224 is considered sufficiently settled to make a bit determination of the most significant bit. Once settled, since the example of 0.384 volts representing the sampled analog signal is less than 0.5 volts, bit 9 is determined to be a logic zero.

As a result, the succeeding bit determination of bit 8 will cause a switching transistor at the midpoint of the lower half of resistor string 212 (M(N/4)) to couple the midpoint of the lower half of the resistor string 212 to bus 218. This can be stated as the VREFHIGH/4 point on resistor string 212 since VREFLOW is ground.

Figure 4:
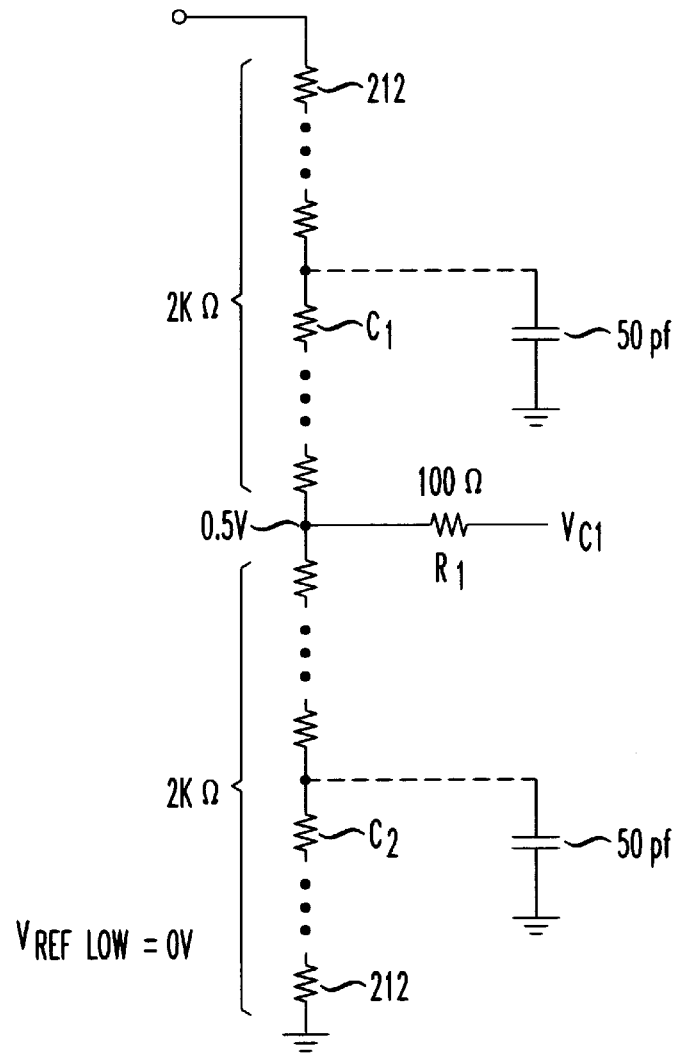
FIGS. 4, 5 and 6 are equivalent circuits to the successive approximation circuit of FIG. 2 when determining the second most significant bit.
Figure 5:
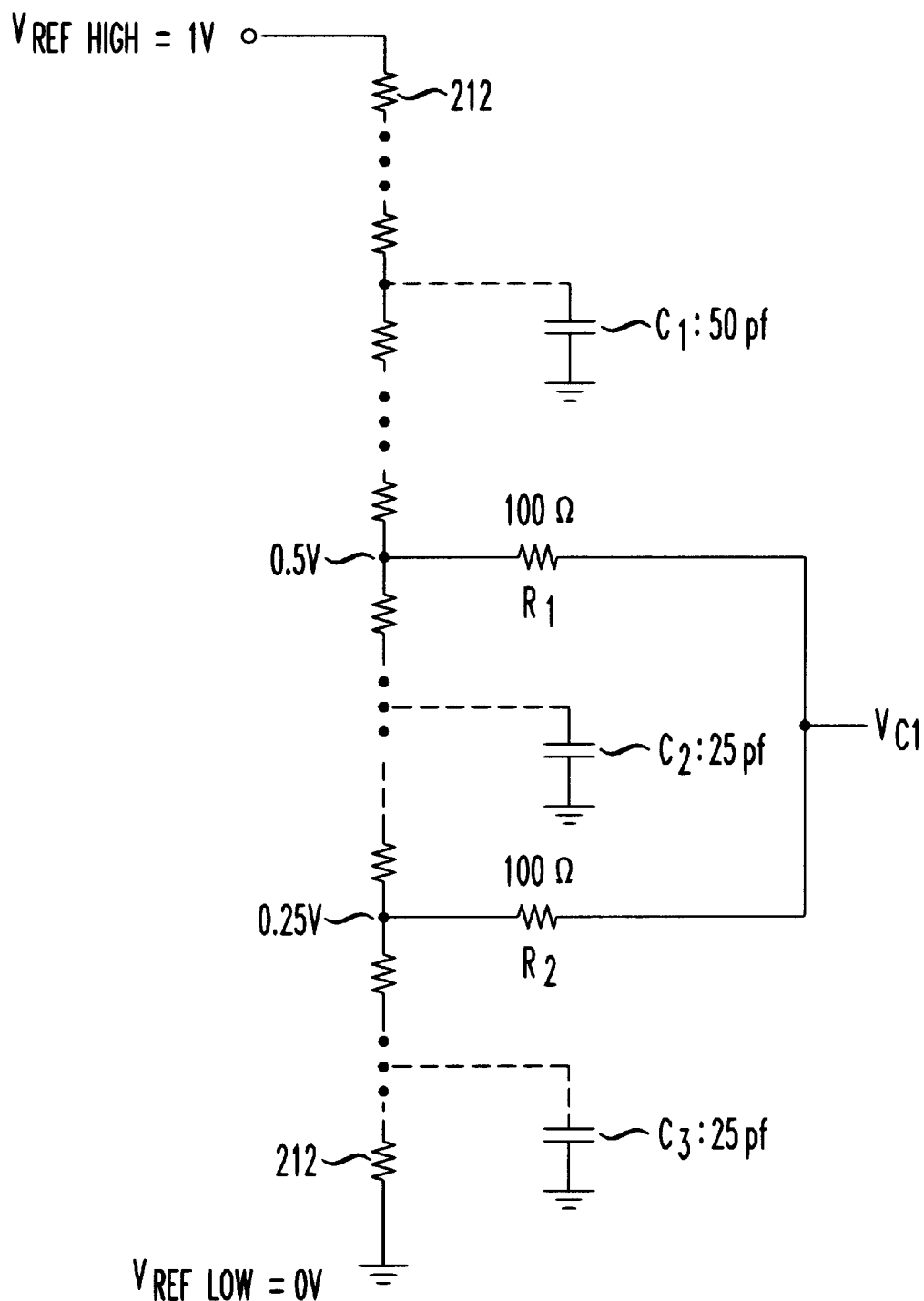
Figure 6:
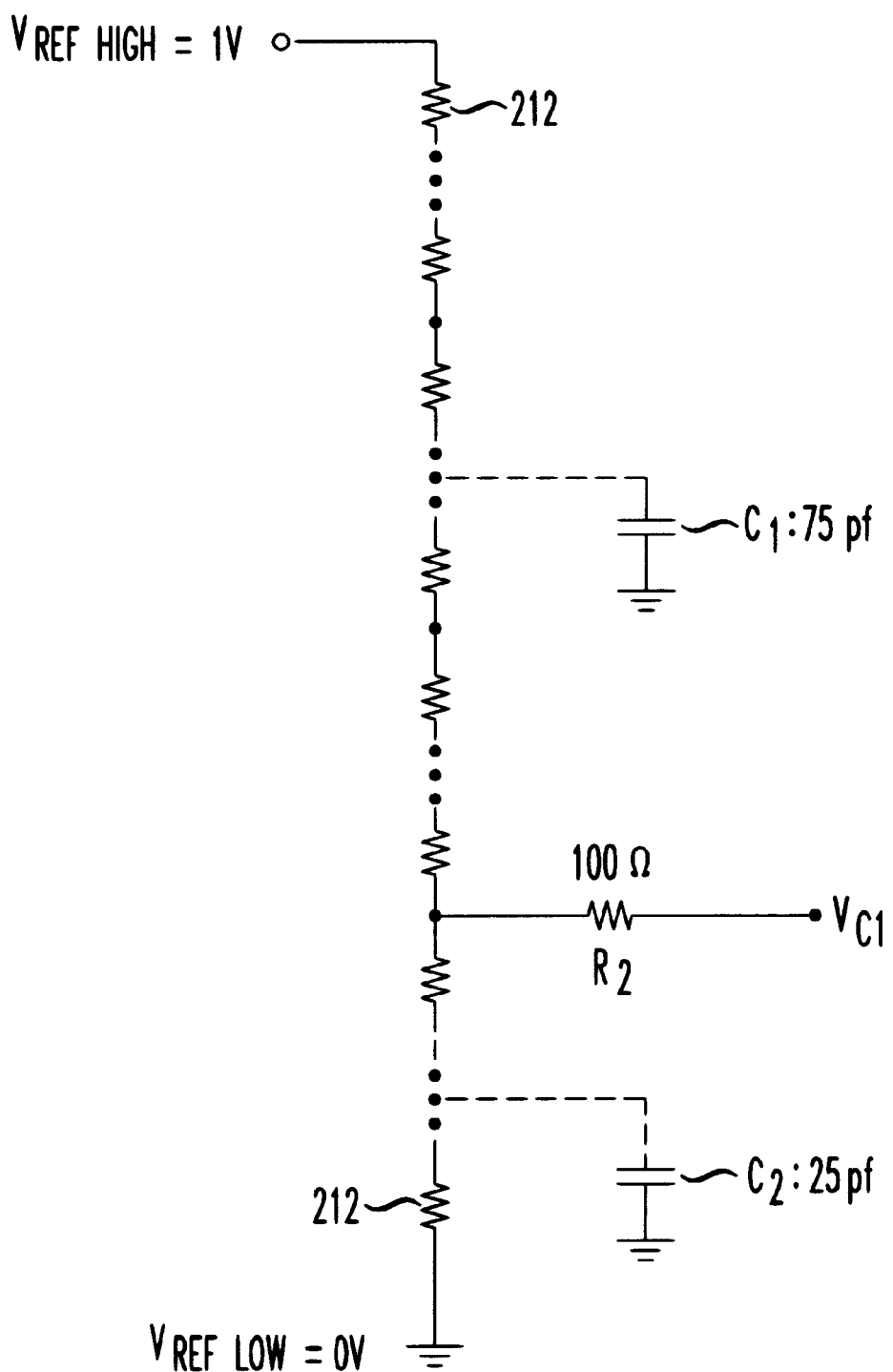

FIGS. 4, 5 and 6 are equivalent circuits to the successive approximation circuit of FIG. 2 when determining the second-most significant bit at the onset of the second most significant bit determination, during the second most significant bit determination and at the end of the second most significant bit determination, respectively. Assuming the distributed capacitances (shown in dashed lines) are the sum of individual resistor string-connected switches M1–MN, and assume that during the decode uncertainty, the section of resistors between the former tap (0.5 volts) and the next tap (0.25 volts) is shorted for a sufficient time that the distributed capacitance between 0.5 volts and 0.25 volts assumes a charge midway between those two voltages before attempting to settle to the new voltage of 0.25 volts. Also assuming that only after node N1 has settled to within one LSB value (0.001 volts) of the new tap voltage of 0.25 volts, that is to between 0.249 and 0.251 volts, can the bus and comparator structure settle. Three segments of the resistor string should be considered. From the midpoint to VREFHIGH, from the midpoint to the midpoint of the lower half of the resistor string and from the midpoint of the lower half of the resistor string to VREFLOW. Since the interim value is half-way between the starting value and the final value and since the resistance and capacitance haven't changed, then the discharge time constant equals the charge time constant and the time for each of the segments to settle to their interim value is approximately equal to the time for each of them to settle to their final values. While all of the segments are simultaneously attempting to settle to steady state values, as a first order approach, the longest settling time segment can be considered as the worst case. For determination of the second-most significant bit, that is the segment with the largest differential voltage, resistance and capacitance which is the segment of resistor string 212 between the midpoint of resistor string 212 and voltage reference VREFHIGH.

With resistor string 212 having an impedance, for this example of 4 kilohms from FIG. 4, the segment from the midpoint of resistor string 212 to voltage reference VREFHIGH has an impedance of 2 kilohms as the second most significant bit determination proceeds from its initial state (FIG. 4) to its interim state (FIG. 5). The midpoint voltage of this segment changes from 0.75 volts to 0.66 volts as the decoder 236 switches its 1 of $2^n-1$ outputs from the midpoint i.e., $(2^n-1)/2$ to the quarter point i.e., $(2^{n-1})/4$ a change of 0.09 volts. Since the voltage must settle to within the value of one LSB of 0.09 volts, that is to within 0.089 volts, the settling time constant can be calculated as 225 nanoseconds. For the upper half of the resistor string 212 to resettle to its original value of 0.75 volts then requires twice as long, i.e., 2×225 nanoseconds or 450 nanoseconds since the charge time equals the discharge time.

To complete the settling time prior to the determination of the second most significant bit (here bit 8 in the example) the time for the bus 218 and comparator 224 to settle is determined as the time required to drop the voltage at node N1 from 0.5 volts (the final value in the determination of the MSB) to within one LSB of 0.25 volts. Since the bus 218 resistance is very low and the input capacitance of the capacitor is also very low the resultant RC time constant is very low especially compared with the time constant due to resistor string resistors and switch capacitance. Typical calculations yield an RC time constant of less than one (1) nanosecond. Since the settling time required for the bus and comparator to settle to within the value of one LSB of its final value is greater than an order of magnitude smaller than the time required for the resistor string itself to settle, the settling time for the bus and comparator may be ignored.

Similar calculations on subsequent bit determinations can be made and are summarized in Table 1. Table 1 also includes individual bit decisions for converting the sampled analog input of 0384 volts.

TABLE 1

| Bit No. | Settling Time of Only resistor String (ns) | String Voltage Selected (volts) | Bit Decision | Running Digital Output |
| --- | --- | --- | --- | --- |
| 9 | — | 0.500 | 0 | 0 |
| 8 | 450 | 0.250 | 1 | 01 |
| 7 | 1187 | 0.375 | 1 | 011 |
| 6 | 827 | 0.4375 | 0 | 0110 |
| 5 | 631 | 0.40625 | 0 | 01100 |
| 4 | 466 | 0.390625 | 0 | 011000 |
| 3 | 267 | 0.382812 | 1 | 0110001 |
| 2 | 55 | 0.386719 | 0 | 01100010 |
| 1 | — | 0.384765 | 0 | 011000100 |
| 0 | — | 0.383789 | 1 | 0110001001 |

Based on the settling time of the string only, it can be seen from Table 1 that the same during time and hence the same duration clock cycle is not required for each bit determination. As shown in Table 1, the perturbance in the resistor string for bits one and zero is less than one LSB and therefore calculations to within one LSB are not meaningful. While there is a settling time required, it is significantly less than the higher order bits. Note that the time calculations do not account for comparator switching time since comparator switching time is order of magnitude less than string settling time.

Adding a period of time, such as 20 nanoseconds, to allow for digital processing of each bit, the total time required for each bit determination is shown in Table 2.

TABLE 2

| Bit No. | Settling Time Plus Overhead Time (ns) | "Equal Period" Period/Clock Rate (ns/Mhz) | "Programmed Period" Period/Clock Rate (ns/Mhz) |
|---|---|---|---|
| 9 | 20 | 2000/0.5 | 31.25/32 |
| 8 | 470 | 2000/0.5 | 500/2 |
| 7 | 1207 | 2000/0.5 | 2000/0.5 |
| 6 | 847 | 2000/0.5 | 1000/1 |
| 5 | 651 | 2000/0.5 | 1000/1 |
| 4 | 486 | 2000/0.5 | 500/2 |
| 3 | 287 | 2000/0.5 | 500/2 |
| 2 | 75 | 2000/0.5 | 500/2 |
| 1 | 20 | 2000/0.5 | 31.25/32 |
| 0 | 20 | 2000/0.5 | 31.25/32 |
| TOTAL | 4.083us | 20.0 us | 6.093 us |

Assuming a master clock having a frequency of 32 Mhz, the closest period that satisfies the worst case bit settling time can be determined and is shown in the equal period column of Table 2. A clock period that is repeatedly divisible by two can be employed to provide various clock frequencies and have various duration clock cycles. The appropriate duration clock cycle may be selected for each bit determination. As shown in Table 2, under the programmed period column, a converter 110 employing a clock period repeatedly divisible by two would require only 49% more time to complete the conversion than the theoretical minimum amount of time to convert a sampled analog signal to a digitally encoded representation. Employing a fixed period clock in converter 110 requires 390% more time than the theoretical minimum amount of time to complete the conversion.

One skilled in the art could employ the teaching of this technique for any number of bits to calculate the duration of time required for each bit determination based on (1) the time constant of an equivalent circuit in the converter that must settle, (2) the voltages applied to the circuits, (3) the worst case final value to which the circuit must settle, (4) a tolerance of the voltage which the circuit must settle as determined by the voltage represented by the least significant bit. The duration of time thus calculated is used to determine which clock signal to employ in a particular conversion. Each bit determination may employ a different clock frequency, or a particular clock frequency could be used for multiple bit determinations. The clock signals may be generated within the analog-to-digital converter, or may be provided to the analog-to-digital converter.

While the invention has been illustrated using an analog-to-digital converter including a single ended, resistor string, where the converter produces a digitally encoded representation of a sampled analog signal using a specific number of bits, the invention is not limited thereto. Also while the invention has been illustrated using a resistor string comprised of $2^n$ equal resistance resistors, the invention is not limited thereto. Furthermore, the invention may be used in an integrated circuit such as a microprocessor, microcontroller or digital signal processor, or be a stand-alone converter.

What is claimed is:

1. A method of converting an analog signal to a digital representation, comprising the steps of:

sampling an analog signal to generate a sampled analog signal;

providing the sampled analog signal to a successive approximation circuit;

clocking the successive approximation circuit by a first clock having a first clock frequency to determine a first bit of a digital representation of the sampled analog signal; and clocking the successive approximation circuit by a second clock having a clock frequency different from the first clock frequency to determine a second bit of the digital representation of the sampled analog signal.

2. The method of claim 1, wherein the second clock frequency is greater than the first clock frequency.

3. A method of converting an analog signal to a multibit representation, comprising the steps of:

sampling an analog signal to generate a sampled analog signal;

providing the sampled analog signal to a successive approximation circuit;

clocking the successive approximation circuit by a clock signal to determine each bit of the multibit representation; and changing the frequency of the clock signal applied to the successive approximation circuit between at least two of the bit determinations.

4. The method of claim 3, wherein the step of changing the frequency of the clock signal comprises changing the frequency of the clock signal applied to the successive approximation circuit between any two sequential bit determinations.

5. The method of claim 3, wherein the step of changing the frequency of the clock signal comprises increasing the frequency of the clock between at least two of the bit determinations.

6. An integrated circuit including an analog-to-digital converter, comprising:

a clock generation circuit for generating a plurality of clock signals, each of the plurality of clock signals having a different frequency;

a successive approximation circuit for determining bits of a digital representation of a sample of an analog signal input to the successive approximation circuit, the successive approximation circuit adapted to receive a clock signal from the clock generation circuit; and a selector circuit adapted to receive the plurality of clock signals from the clock generation circuit and to select one of the clock signals to provide to the successive approximation circuit.

7. An integrated circuit as recited in claim 6, wherein the selector circuit selects a clock signal in response to a signal received from the successive approximation circuit.

8. An integrated circuit as recited in claim 7, wherein the signal received by the selector circuit from the successive approximation circuit is indicative of the bit being determined by the successive approximation circuit.

9. An integrated circuit as recited in claim 6, wherein the integrated circuit is a digital signal processor.

* * * * *